(12) United States Patent
Tesanovic et al.

(10) Patent No.: US 11,296,270 B2
(45) Date of Patent: Apr. 5, 2022

(54) OPTOELECTRONIC MODULES HAVING TRANSPARENT SUBSTRATES AND METHOD FOR MANUFACTURING THE SAME

(71) Applicant: ams Sensors Singapore Pte. Ltd., Singapore (SG)

(72) Inventors: Bojan Tesanovic, Eindhoven (NL); Nicola Spring, Eindhoven (NL)

(73) Assignee: ams Sensors Singapore Pte. Ltd., Singapore (SG)

( * ) Notice: Subject to any disclaimer, the term of this patent is extended or adjusted under 35 U.S.C. 154(b) by 135 days.

(21) Appl. No.: 16/957,185

(22) PCT Filed: Dec. 26, 2018

(86) PCT No.: PCT/SG2018/050629
§ 371 (c)(1),
(2) Date: Jun. 23, 2020

(87) PCT Pub. No.: WO2019/132776
PCT Pub. Date: Jul. 4, 2019

(65) Prior Publication Data
US 2020/0395523 A1 Dec. 17, 2020

Related U.S. Application Data

(60) Provisional application No. 62/610,660, filed on Dec. 27, 2017.

(51) Int. Cl.
*H01L 33/62* (2010.01)
*H01L 31/02* (2006.01)
(Continued)

(52) U.S. Cl.
CPC .......... *H01L 33/62* (2013.01); *H01L 31/0203* (2013.01); *H01L 31/02005* (2013.01);
(Continued)

(58) Field of Classification Search
CPC ........... H01L 31/02005; H01L 31/0203; H01L 31/02325; H01L 33/62; H01L 33/58;
(Continued)

(56) References Cited

U.S. PATENT DOCUMENTS 8,884,165 B2 * 11/2014 Kamada .................. B81B 7/007
174/255
2004/0069999 A1 * 4/2004 Lin .......................... H01L 33/60
257/88

(Continued)

OTHER PUBLICATIONS

International Preliminary Report on Patentability for related Application No. PCT/SG2018/050629 dated Jun. 30, 2020 (8 Pages).
(Continued)

*Primary Examiner* — Igwe U Anya
(74) *Attorney, Agent, or Firm* — Michael Best & Friedrich LLP

(57) ABSTRACT

Optoelectronic modules exhibiting relatively small thickness and methods for their manufacture are disclosed. The optoelectronic modules include substrates and transparent covers. Each optoelectronic module includes a transparent substrate on which an optoelectronic component is mounted. The optoelectronic component can be sensitive to and/or operable to generate a particular wavelength of electromagnetic radiation. The transparent substrate is transmissive to the particular wavelength of electromagnetic radiation. In some instances, the transparent substrate is composed, at least partially of glass.

19 Claims, 7 Drawing Sheets

(51) Int. Cl.
   *H01L 31/0203* (2014.01)
   *H01L 31/0232* (2014.01)
   *H01L 33/54* (2010.01)
   *H01L 33/58* (2010.01)
   *H01S 5/02* (2006.01)
   *H01S 5/02216* (2021.01)
   *H01S 5/02325* (2021.01)

(52) U.S. Cl.
   CPC ........ *H01L 31/02325* (2013.01); *H01L 33/54* (2013.01); *H01L 33/58* (2013.01); *H01S 5/0201* (2013.01); *H01S 5/02216* (2013.01); *H01S 5/02325* (2021.01); *H01L 2933/005* (2013.01); *H01L 2933/0058* (2013.01)

(58) Field of Classification Search
   CPC ............... H01L 33/54; H01L 2933/005; H01L 2933/0058; H01S 5/0201; H01S 5/02216; H01S 5/02335
   USPC ........................................................ 257/98
   See application file for complete search history.

(56) References Cited

U.S. PATENT DOCUMENTS

| | | |
|---|---|---|
| 2010/0025794 A1 | 2/2010 | Lu |
| 2014/0369033 A1* | 12/2014 | Palfreyman ........... F21V 21/005 362/183 |
| 2015/0243853 A1 | 8/2015 | Cha et al. |

OTHER PUBLICATIONS

International Search Report with Written Opinion for related Application No. PCT/SG2018/050629 dated Mar. 7, 2019 (10 Pages).

* cited by examiner

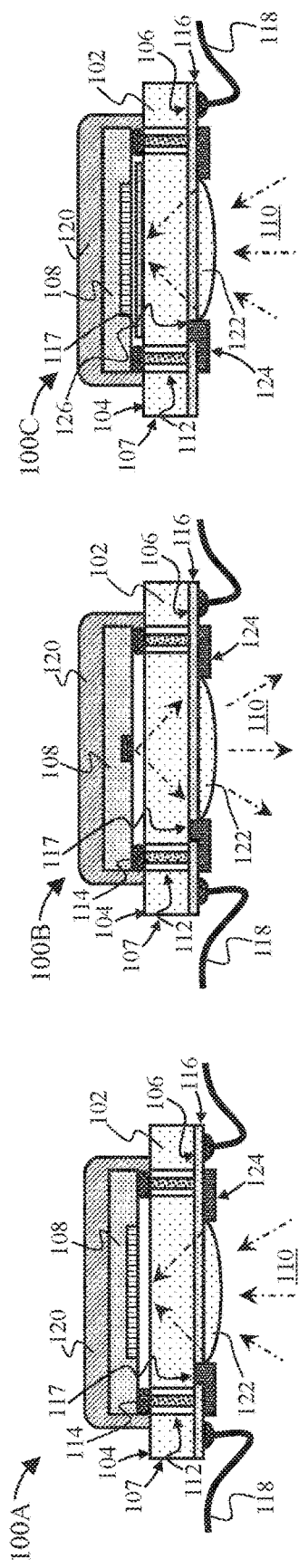

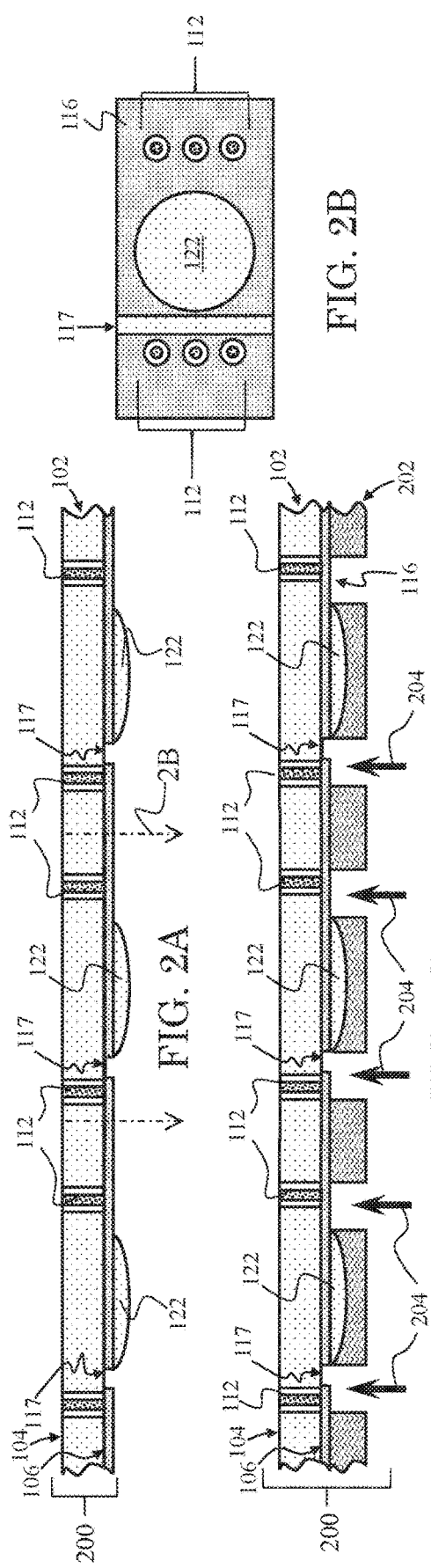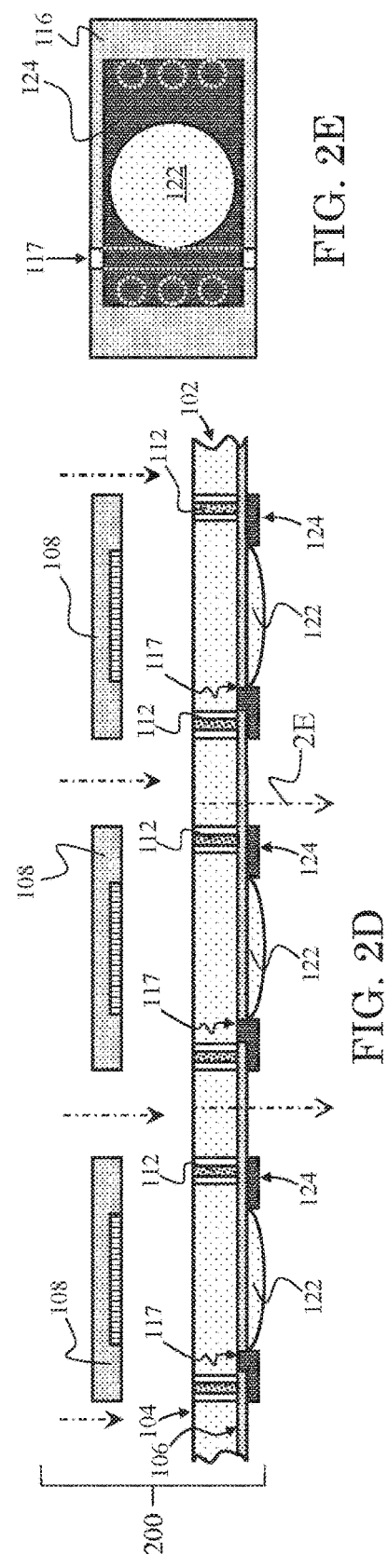

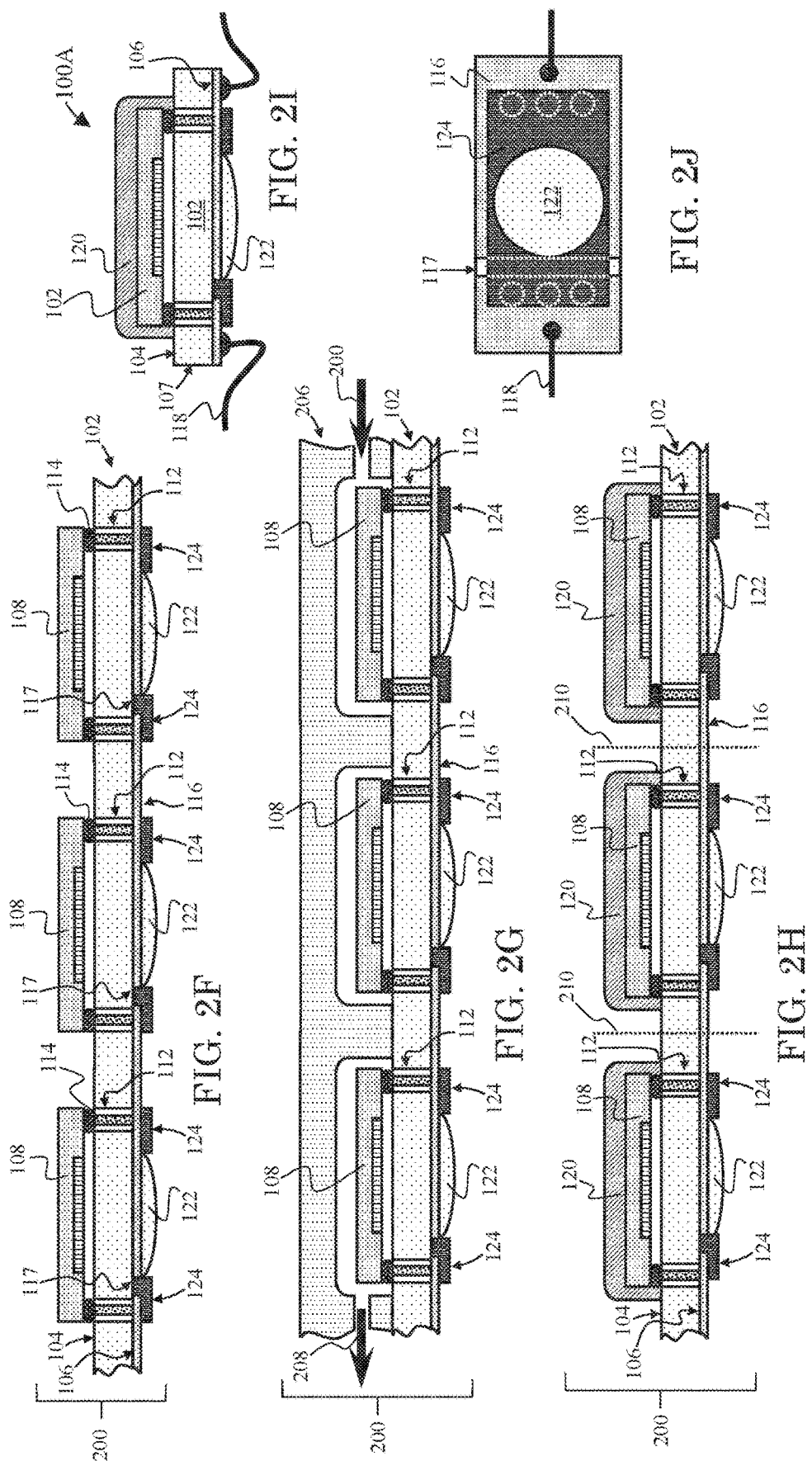

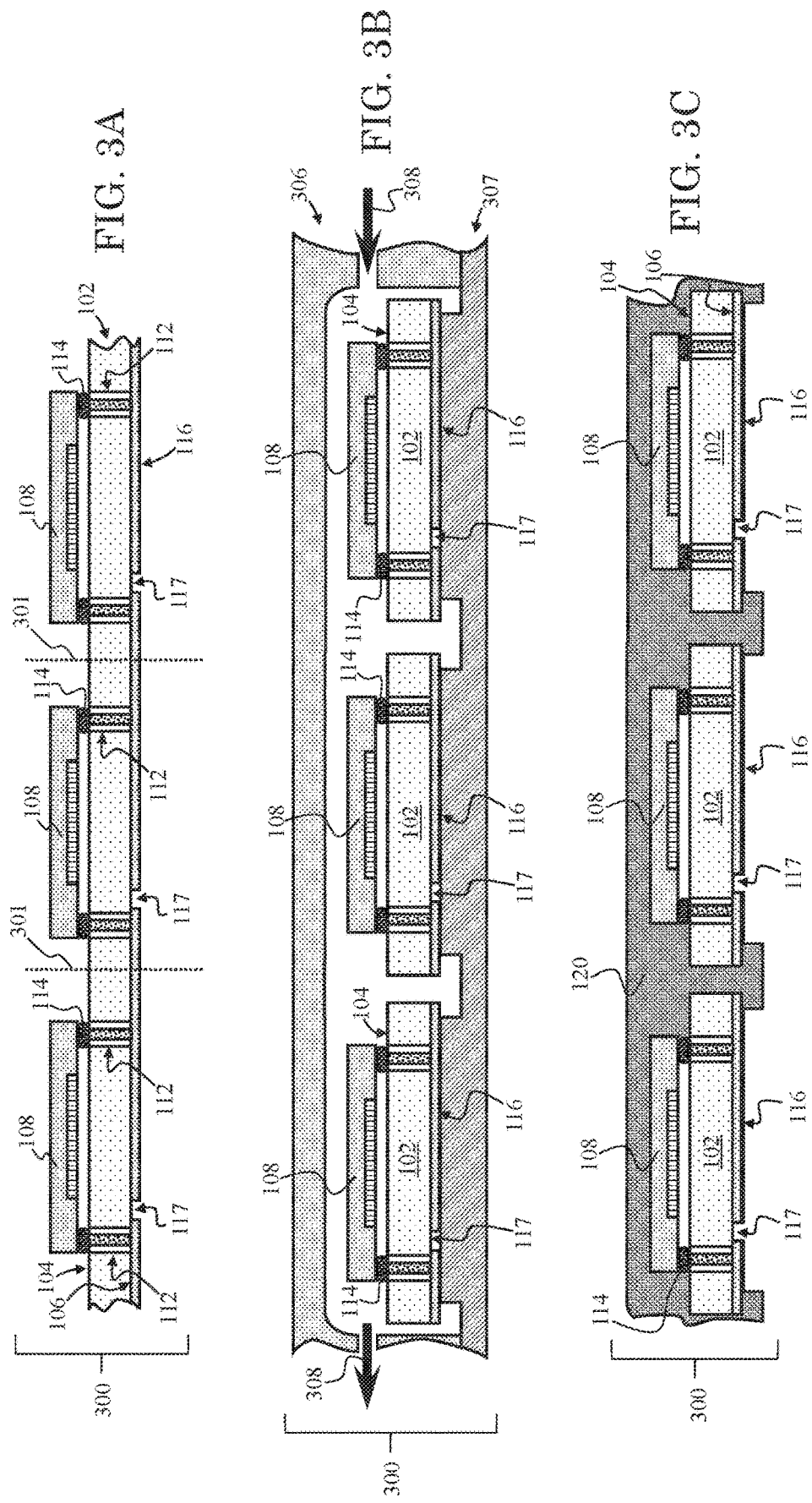

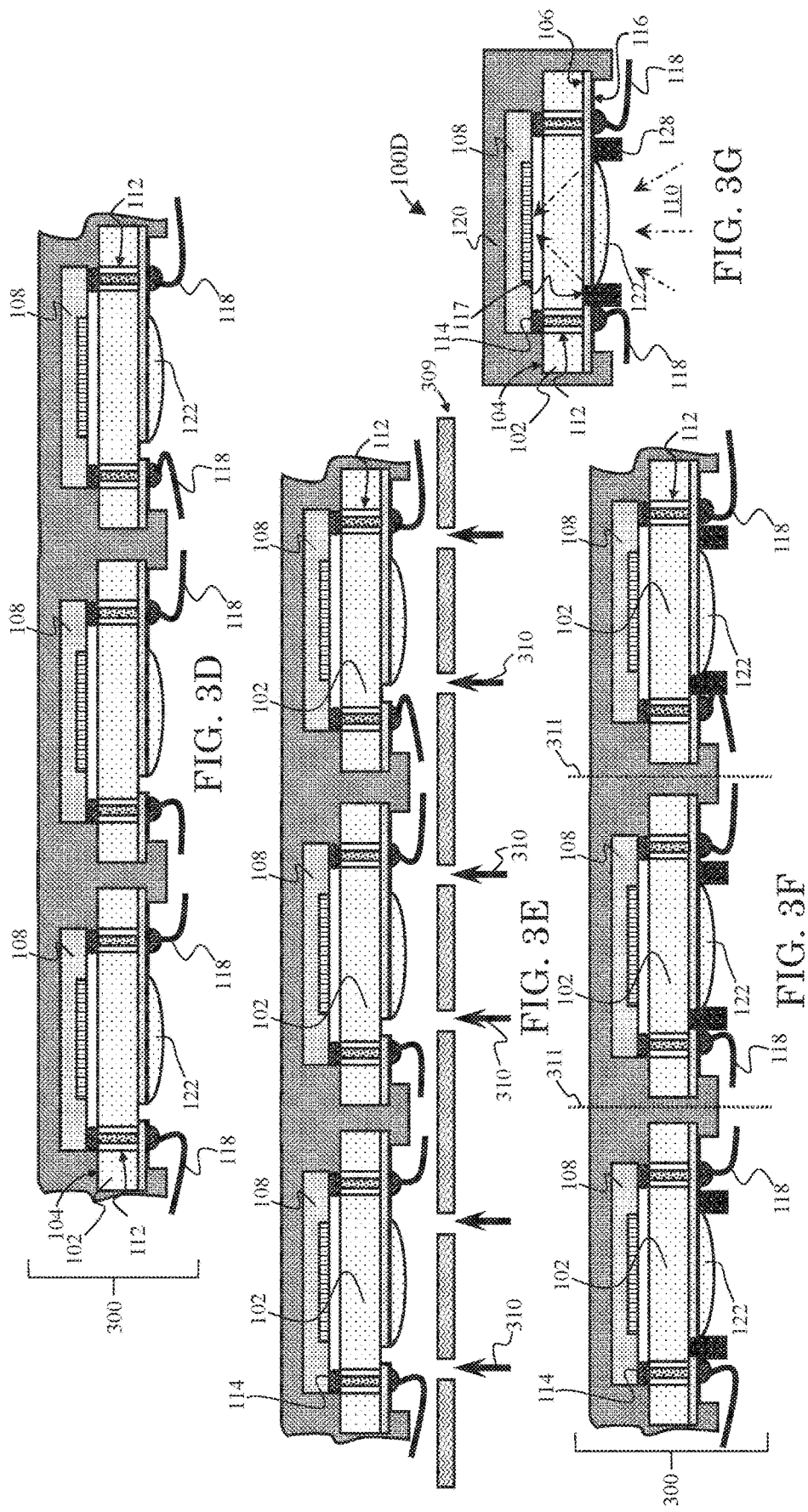

OPTOELECTRONIC MODULES HAVING TRANSPARENT SUBSTRATES AND METHOD FOR MANUFACTURING THE SAME

CROSS-REFERENCE TO RELATED APPLICATION

The present application is the U.S. national stage entry, under 35 U.S.C. § 371, of International Application No. PCT/SG2018/050629, filed Dec. 26, 2018, which claims the benefit of priority of U.S. Provisional Patent Application No. 62/610,660 filed on Dec. 27, 2017, the contents of which are incorporated by reference herein in their entirety.

FIELD OF THE DISCLOSURE

The present disclosure relates to optoelectronic modules having transparent substrates and methods for manufacturing such modules.

BACKGROUND

A typical optoelectronic module, such as a proximity sensor, a structured-light generator, a two- or three-dimensional imaging camera, or an ambient light sensor, includes a substrate on which an optoelectronic component is mounted. The substrate can provide both mechanical support and a means for electrically connecting the optoelectronic component to other components, such as circuitry, processors, power sources, and so forth. The optoelectronic module, also can include a transparent cover configured to protect the optoelectronic component without impeding its ability to detect and/or generate light.

The overall thickness of the optoelectronic module, however, tends to be increased by the thickness of the substrate and the transparent cover, leading to a thickness that is unsuitable for some applications. For example, a host device with relatively small dimensions, such as wearable devices and other mobile devices (e.g., electronic tablets, notebooks, and portable media players), may not accommodate an optoelectronic module that is relatively thick. Consequently, a relatively thin optoelectronic module having both a substrate and a transparent cover is needed.

SUMMARY

This disclosure describes optoelectronic modules that include both substrates and transparent covers and exhibiting relatively small thicknesses. For example, in accordance with one aspect, an optoelectronic module includes an optoelectronic component disposed on a first side of a transparent substrate, the optoelectronic component being sensitive to and/or operable to generate a particular wavelength of electromagnetic radiation, and the transparent substrate being transmissive to the particular wavelength of electromagnetic radiation. In some instances, the transparent substrate is composed, at least partially of glass.

The optoelectronic module further can include a conductive layer disposed on a second side of the transparent substrate and a plurality of electrically conductive vias disposed between the first and second sides of the transparent substrate and being in electrical communication with the optoelectronic component and the conductive layer, the conductive layer being transmissive to the particular wavelength. In some implementations, the conductive layer includes a conductive film and a structuration, the structuration being configured to electrically isolate portions of the conductive film. In some implementations, the conductive film is at least partially composed of indium tin oxide. In some implementations, the conductive layer includes a plurality of conductive traces. In some implementations, the plurality of conductive traces is at least partially composed of copper.

The optoelectronic module further can include a plurality of electrical connectors disposed on the conductive layer, the electrical connectors being in electrical communication with the optoelectronic component via the conductive layer and the plurality of electrically conductive vias.

The optoelectronic module further can include a housing disposed on at least the first side of the transparent substrate and further being disposed such that the optoelectronic component is at least partially encapsulated by the housing, the housing be substantially non-transmissive to the particular wavelength. In some implementations, the housing is disposed on the lateral sides of the transparent substrate. In some implementations, the housing is disposed on at least a portion of the second side of the transparent substrate.

The optoelectronic module as further can include an optical element and/or optical film disposed on the electrically conductive layer. In some instances, the optical element and/or the optical film is disposed on the first side and/or the second side of the transparent substrate. In some instances, the optical element and/or the optical film is a diffuser, a refractive optical element, a diffractive optical element, a microlens array, and/or an optical filter.

The optoelectronic module further can include an aperture and/or a baffle. In some instances, at least a portion of the aperture and/or the baffle is integrated into at least a portion of the structuration.

This disclosure also describes methods of manufacturing optoelectronic modules that includes both substrates and transparent covers and that exhibit relatively small thicknesses. For example, in accordance with one aspect, a method includes:

providing a wafer assembly including a transparent substrate having first, second, and lateral sides, the wafer assembly further including a plurality of electrically conductive vias disposed between the first and second sides, the wafer assembly further including a conductive film disposed on the second side of the transparent substrate, the conductive film being in electrical communication with the electrically conductive vias;

structuring the conductive film such that a plurality of structurations within the conductive film is generated, the conductive film and structuration being, at least in part, a conductive layer;

mounting a plurality of optical elements onto the second side of the transparent substrate;

mounting a mask onto the second side of the transparent substrate;

applying an aperture material to the second side of the transparent substrate through the mask;

mounting a plurality of optoelectronic components to the first side of the transparent substrate, each of the optoelectronic components being sensitive to and/or operable to generate a particular wavelength of electromagnetic radiation;

curing the aperture material with electromagnetic radiation and/or thermal energy such that a plurality of apertures is formed, each of the apertures being substantially non-transmissive to the particular wavelength of electromagnetic radiation;

mounting a housing tool to the first side of the transparent substrate;

introducing formable material into the housing tool such that the plurality of optoelectronic components are at least partially encapsulated;

curing the formable material with electromagnetic radiation and/or thermal energy such that a plurality of housings is formed, each of the housings being substantially non-transmissive to the particular wavelength of electromagnetic radiation; and dicing through the wafer assembly such that a plurality of discrete optoelectronic modules are generated.

In some implementations, the method further includes mounting a plurality of electrical connectors to the conductive layer, the electrical connectors being in electrical communication with the plurality of optoelectronic components via the conductive layer and the plurality of electrically conductive vias.

In another aspect, for example, a method includes:

providing a wafer assembly including a transparent substrate having first, second, and lateral sides, the wafer assembly further including a plurality of electrically conductive vias disposed between the first and second sides, the wafer assembly further including a conductive film disposed on the second side of the transparent substrate, the conductive film being in electrical communication with the electrically conductive vias;

structuring the conductive film such that a plurality of structurations within the conductive film is generated, the conductive film and structuration being, at least in part, a conductive layer;

mounting a plurality of optoelectronic components to the first side of the transparent substrate, each of the optoelectronic components being sensitive to and/or operable to generate a particular wavelength of electromagnetic radiation;

dicing through the transparent substrate such that the wafer assembly includes a plurality of discrete components, each discrete component includes an optoelectronic component, transparent substrate, conductive film, and structurations within the conductive film;

mounting the plurality of discrete components onto a sidewall tool;

mounting a housing tool onto the sidewall tool;

introducing a formable material into the sidewall tool and housing tool such that the plurality of discrete components is at least partially encapsulated in the formable material;

curing the formable material with electromagnetic radiation and/or thermal energy such that a plurality of housings is formed, each of the housings being substantially non-transmissive to the particular wavelength of electromagnetic radiation;

mounting a plurality of optical elements onto the second side of the transparent substrate;

mounting a plurality of electrical connectors to the conductive layer, the electrical connectors being in electrical communication with the plurality of optoelectronic components via the conductive layer and the plurality of electrically conductive vias;

mounting a mask onto the second side of the transparent substrate;

applying a baffle material to the second side of the transparent substrate through the mask;

curing the baffle material with electromagnetic radiation and/or thermal energy such that a plurality of baffles is formed, each of the baffles being substantially non-transmissive to the particular wavelength of electromagnetic radiation; and dicing through the wafer assembly such that a plurality of discrete optoelectronic modules are generated.

Other aspects, features and advantages will be readily apparent from the following detailed description, the accompanying drawings, and the claims.

BRIEF DESCRIPTION OF THE DRAWINGS

FIGS. 1A-1F depict example optoelectronic modules 100A-100F.

FIGS. 2A-2J depict an example method for manufacturing a plurality of discrete optoelectronic modules as depicted in FIG. 1A and further illustrated in FIG. 4.

FIGS. 3A-3G depict an example method for manufacturing a plurality of discrete optoelectronic modules as depicted in FIG. 1D and further illustrated in FIG. 5.

DETAILED DESCRIPTION

Figure 4:
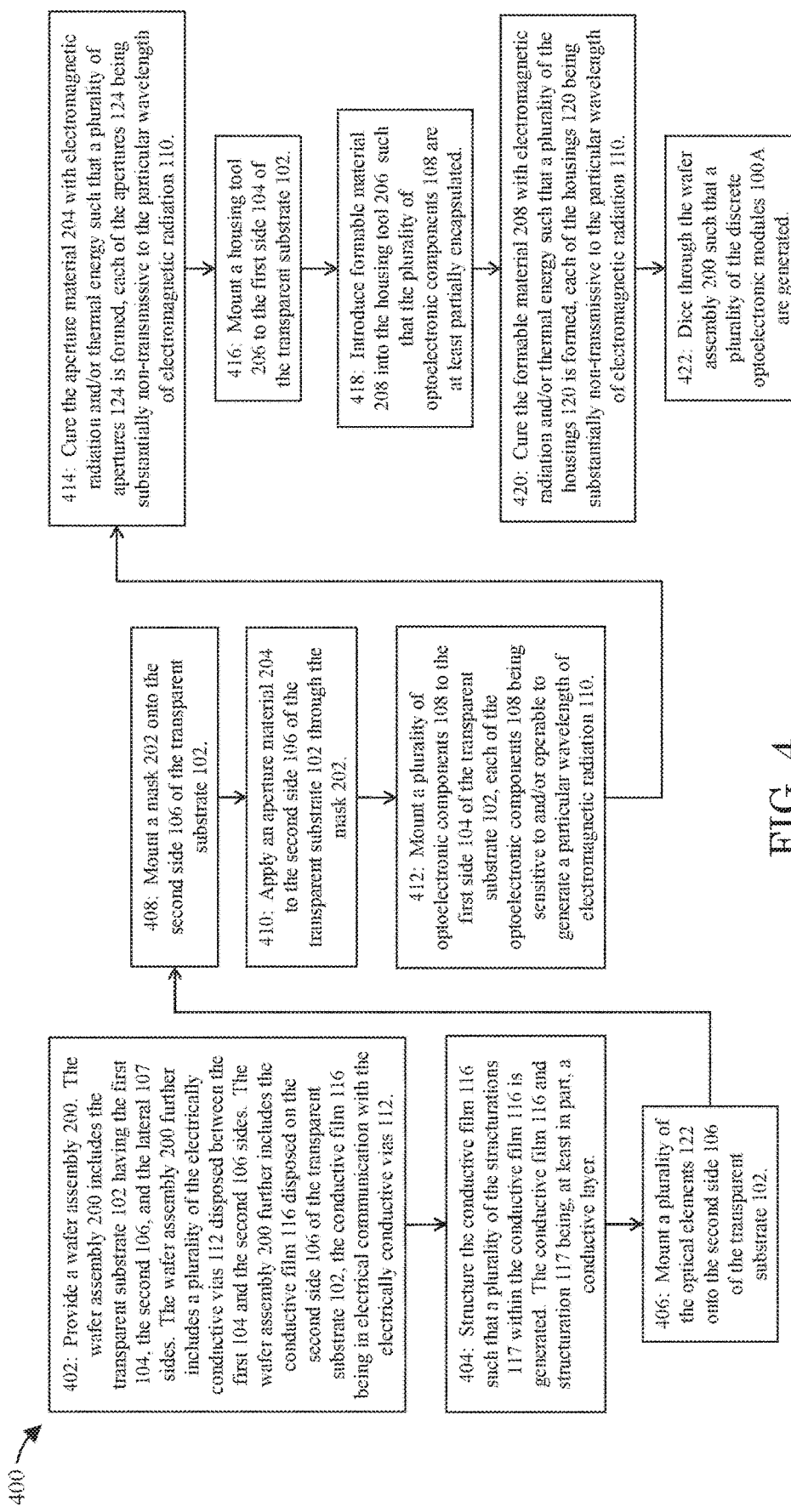
FIG. 4 illustrates an example method for manufacturing a plurality of discrete optoelectronic modules as depicted in FIG. 1A and further depicted in FIGS. 2A-2J.

FIGS. 1A-1F depict examples of optoelectronic modules 100A-100F, respectively. Each of the optoelectronic modules 100A-100F includes both a substrate and transparent cover and exhibits a relatively small thickness. Consequently, the optoelectronic modules 100A-100F can be accommodated within host devices characterized by relatively small dimensions, such as wearable devices and other mobile devices (e.g., electronic tablets, notebooks, and portable media players).

FIG. 1A depicts the optoelectronic module 100A, which includes a transparent substrate 102. The transparent substrate 102 has a first side 104, a second side 106, and lateral sides 107. The optoelectronic modules 100A further includes at least one optoelectronic component 108 disposed on the first side 104 of the transparent substrate 102. The optoelectronic component 108 can be mounted (e.g., electrically, and/or thermally) to the transparent substrate 102. The optoelectronic component 108 can be sensitive to and/or operable to generate a particular wavelength of electromagnetic radiation 110 (i.e., radiation centered about a particular wavelength, several particular wavelengths, or a broad range of wavelengths). For example, the optoelectronic component 108 can include any light-generating component, such as a light-emitting diode or laser diode, and/or can include any light-sensitive component, such as a photodiode or image sensor. The transparent substrate can be composed, at least partially of glass, sapphire, or an optical resin; and is configured to be transmissive to the particular wavelength of electromagnetic radiation 110.

The optoelectronic module 100A further includes a conductive layer disposed on a second side 106 of the transparent substrate 102 and a plurality of electrically conductive vias 112 disposed between the first 104 and the second 106 sides of the transparent substrate 102. The electrically conductive vias 112 are in electrical communication with the optoelectronic component 108 and the conductive layer (e.g., via the solder bumps 114). The conductive layer is configured to be transmissive to the particular wavelength of electromagnetic radiation 110.

In some instances, the conductive layer includes a conductive film 116 and structurations 117 configured to electrically isolate portions of the conductive film. The structurations 117 can be channels, for example, bisecting portions the conducting film 116. In some instances, the structurations 117 are formed mechanically (e.g., by physically dicing or grinding away portions of the conductive film 116) or by other means, such as selectively depositing the conductive film 116 to form the structurations 117, or via photolithography techniques. In some instances, the conductive film 116 is composed, at least partially, of indium tin oxide. In some instances, the conductive layer includes a plurality of conductive traces composed of a conductive material, such as copper, nickel, silver, or gold.

The optoelectronic module 100A further includes a plurality of electrical connectors 118 disposed on the conductive layer. The electrical connectors 118 (e.g., electrical wires) being in electrical communication with the optoelectronic component 108 via the conductive layer and the plurality of electrically conductive vias 112. The electrical connectors 118 can electrically connect the optoelectronic component 108 to other components, such as circuitry, processors, power sources, and so forth The optoelectronic modules 100A further includes a housing 120 disposed on at least the first side 104 of the transparent substrate 102. The housing 120 can be disposed such that the optoelectronic component 108 is at least partially encapsulated by the housing 120. Further, the housing 120 can be substantially non-transmissive to the particular wavelength 110.

The optoelectronic modules 100A further includes an optical element 122 disposed on the second side 104 of the transparent substrate 102. The optical element 122 can be a diffuser, a refractive optical element, a diffractive optical element, a microlens array, and/or an optical filter. In some instances, the optical element 122 is disposed on top of the electrically conductive layer as depicted in FIG. 1A. In some instances, the optoelectronic modules 100A can further include an aperture 124. The aperture 124 can be composed of a material that is substantially non-transmissive to the particular wavelength 110, such as black chrome or black epoxy.

FIG. 1B depicts an optoelectronic module 100B, which includes the aforementioned numbered components as described above. The optoelectronic component 108, however, is depicted as being operable to generate the particular wavelength 110.

FIG. 1C depicts an optoelectronic module 100C, which includes the aforementioned numbered components as described above and further includes an optical film 126. The optical film 126 can be a diffuser, a refractive optical element, a diffractive optical element, a microlens array, and/or an optical filter FIG. 1D depicts an optoelectronic module 100D, which includes the aforementioned numbered components as described above and depicted in FIGS. 1A and B, except for the aperture 124. The optoelectronic modules 100C further includes a baffle 128, which is substantially non-transmissive to the particular wavelength of electromagnetic radiation 110. The baffle 128 can be composed at least partially of black chrome or black epoxy, for example. Moreover, the optoelectronic modules 100C includes the housing 120 configured to cover the lateral sides 107 of the transparent substrate 102. The housing 120, as depicted in FIG. 1D, can prevent stray light from impinging the optoelectronic component 108.

FIG. 1E depicts an optoelectronic module 100E, which includes the aforementioned numbered components as described above and depicted in FIG. 1D, except for the baffle 128 and the optical element 122.

FIG. 1F depicts an optoelectronic module 100F, which includes the aforementioned numbered components as described above and depicted in FIG. 1B and further includes an optical element 122 disposed on the first side 104 of the transparent substrate 102. The optical element 122 can include a diffuser, a refractive optical element, a diffractive optical element, a microlens array, and/or an optical filter.

FIG. 2 illustrates an example method of manufacturing a plurality of discrete optoelectronic modules, such as the optoelectronic module 100A depicted in FIG. 1A, and is further illustrated in FIG. 4 and described below.

Figure 5:
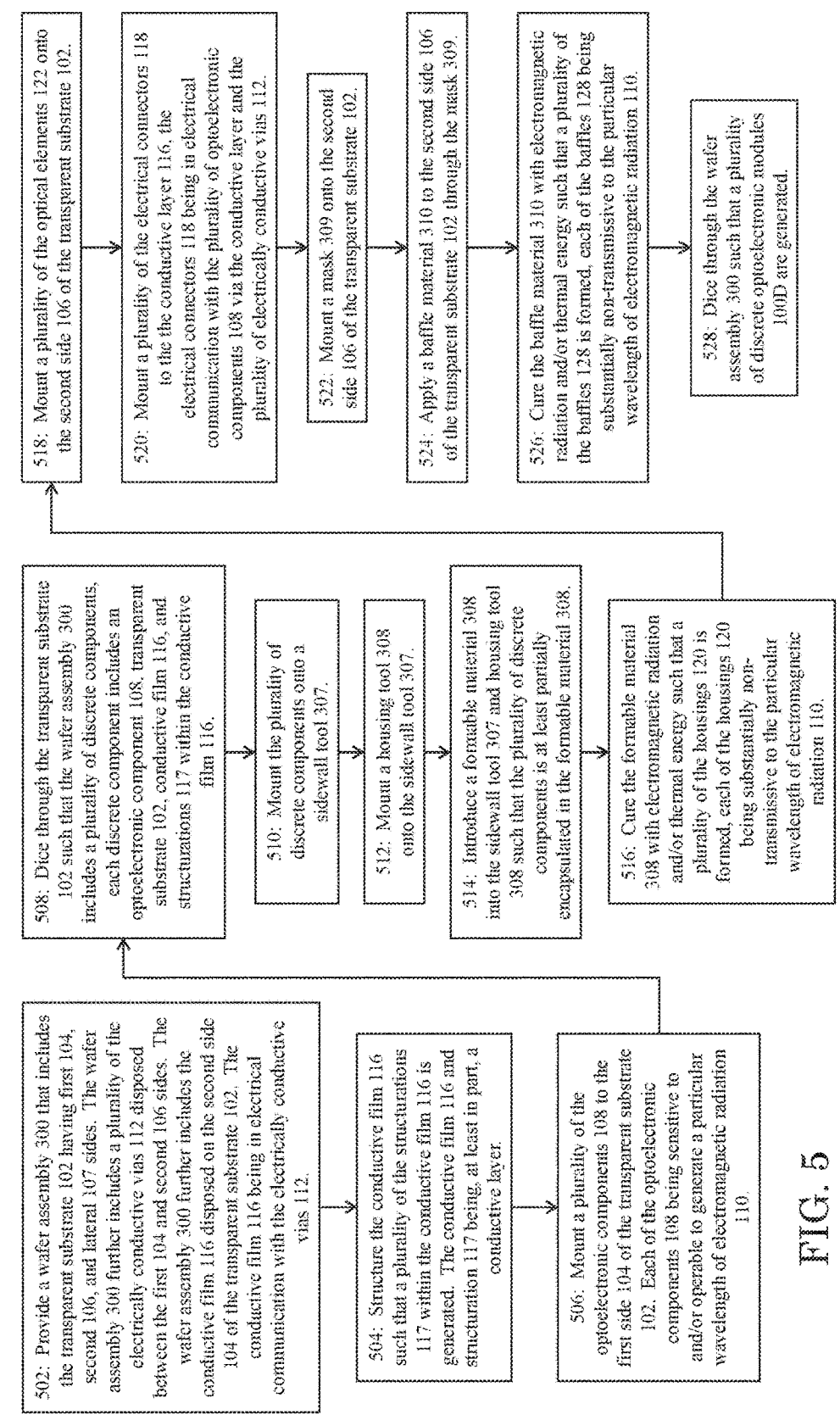
FIG. 5 illustrates an example method for manufacturing a plurality of discrete optoelectronic modules as depicted in FIG. 1D and further depicted in FIGS. 3A-3G.

FIG. 3 illustrates an example method of manufacturing a plurality of discrete optoelectronic modules, such as the optoelectronic module 100D depicted in FIG. 1D, and is further illustrated in FIG. 5.

FIG. 4 illustrates an example method of manufacturing a plurality of discrete optoelectronic modules, such as the optoelectronic module 100A depicted in FIG. 1A, and is further illustrated in FIGS. 2A-2H. At 402 a wafer assembly 200 is provided. The wafer assembly 200 includes the transparent substrate 102 having the first 104, the second 106, and the lateral 107 sides. The wafer assembly 200 further includes a plurality of the electrically conductive vias 112 disposed between the first 104 and the second 106 sides. The wafer assembly 200 further includes the conductive film 116 disposed on the second side 106 of the transparent substrate 102, the conductive film 116 being in electrical communication with the electrically conductive vias 112.

At 404, the conductive film 116 is structured such that a plurality of the structurations 117 within the conductive film 116 is generated. The conductive film 116 and structuration 117 being, at least in part, a conductive layer.

At 406, a plurality of the optical elements 122 is mounted onto the second side 106 of the transparent substrate 102.

At 408, a mask 202 is mounted onto the second side 106 of the transparent substrate 102.

At 410, an aperture material 204 is applied to the second side 106 of the transparent substrate 102 through the mask 202.

At 412, a plurality of optoelectronic components 108 is mounted to the first side 104 of the transparent substrate 102, each of the optoelectronic components 108 being sensitive to and/or operable to generate a particular wavelength of electromagnetic radiation 110.

At 414, the aperture material 204 is cured with electromagnetic radiation and/or thermal energy such that multiple apertures 124 is formed, each of the apertures 124 being substantially non-transmissive to the particular wavelength of electromagnetic radiation 110.

At 416, a housing tool 206 is mounted to the first side 104 of the transparent substrate 102.

At 418, formable material 208 is introduced into the housing tool 206 such that the plurality of optoelectronic components 108 are at least partially encapsulated.

At 420, the formable material 208 is cured with electromagnetic radiation and/or thermal energy such that a plurality of the housings 120 is formed, each of the housings 120 being substantially non-transmissive to the particular wavelength of electromagnetic radiation 110.

At 422, the wafer assembly 200 is diced through, along dicing lines 210, such that a plurality of the discrete optoelectronic modules 100A are generated.

FIG. 5 illustrates an example method of manufacturing a plurality of discrete optoelectronic modules, such as the optoelectronic module 100D depicted in FIG. 1D, and is further illustrated in FIGS. 3A-3G. At 502, a wafer assembly 300 is provided. The wafer assembly includes the transparent substrate 102 having first 104, second 106, and lateral 107 sides. The wafer assembly 300 further includes a plurality of the electrically conductive vias 112 disposed between the first 104 and second 106 sides. The wafer assembly 300 further includes the conductive film 116 disposed on the second side 104 of the transparent substrate 102. The conductive film 116 being in electrical communication with the electrically conductive vias 112.

At 504, the conductive film 116 is structured such that a plurality of the structurations 117 within the conductive film 116 is generated. The conductive film 116 and structuration 117 being, at least in part, a conductive layer.

At 506, a plurality of the optoelectronic components 108 is mounted to the first side 104 of the transparent substrate 102. Each of the optoelectronic components 108 being sensitive to and/or operable to generate a particular wavelength of electromagnetic radiation 110.

At 508, the transparent substrate 102 is diced through, along dicing lines 301, such that the wafer assembly 300 includes a plurality of discrete components, each discrete component includes an optoelectronic component 108, transparent substrate 102, conductive film 116, and structurations 117 within the conductive film 116.

At 510, the plurality of discrete components is mounted onto a sidewall tool 307.

At 512, a housing tool 308 is mounted onto the sidewall tool 307.

At 514, a formable material 308 is introduced into the sidewall tool 307 and housing tool 308 such that the plurality of discrete components is at least partially encapsulated in the formable material 308.

At 516, the formable material 308 is cured with electromagnetic radiation and/or thermal energy such that a plurality of the housings 120 is formed, each of the housings 120 being substantially non-transmissive to the particular wavelength of electromagnetic radiation 110.

At 518, a plurality of the optical elements 122 is mounted onto the second side 106 of the transparent substrate 102.

At 520, a plurality of the electrical connectors 118 is mounted to the conductive layer 116, the electrical connectors 118 being in electrical communication with the plurality of optoelectronic components 108 via the conductive layer and the plurality of electrically conductive vias 112.

At 522, a mask 309 is mounted onto the second side 106 of the transparent substrate 102.

At 524, a baffle material 310 is applied to the second side 106 of the transparent substrate 102 through the mask 309.

At 526, the baffle material 310 is cured with electromagnetic radiation and/or thermal energy such that a plurality of the baffles 128 is formed, each of the baffles 128 being substantially non-transmissive to the particular wavelength of electromagnetic radiation 110.

At 528, the wafer assembly 300 is diced through, along dicing lines 311, such that multiple discrete optoelectronic modules 100D are generated.

Some of the aforementioned implementations describe a collection of steps for manufacturing pluralities of discrete optoelectronic modules. Various steps are described sequentially, though steps need not occur in the sequence described. Moreover, steps described sequentially may be carried out simultaneously. Further, the example steps described above can be repeated in some instances. Further, modifications can be made to the foregoing implementations, for example additional steps, such as steps involving the application of a releasing agent and steps involving oxygen plasma treatments, can be included in any of the aforementioned implementations. Thus, other implementations are within the scope of the appended claims.

Moreover, some of the aforementioned implementations describe example optoelectronic modules. Modifications can be made to the foregoing implementations, for example, features described above in different implementations may be combined in the same implementation. Thus, still other implementations are within the scope of the appended claims.

What is claimed is:

1. An optoelectronic module comprising:
   an optoelectronic component disposed on a first side of a transparent substrate, the optoelectronic component being sensitive to and/or operable to generate a particular wavelength of electromagnetic radiation, and the transparent substrate being transmissive to the particular wavelength of electromagnetic radiation;
   a conductive layer disposed on a second side of the transparent substrate and a plurality of electrically conductive vias disposed between the first and second sides of the transparent substrate and being in electrical communication with the optoelectronic component and the conductive layer, the conductive layer being transmissive to the particular wavelength;
   a plurality of electrical connectors disposed on the conductive layer, the electrical connectors being in electrical communication with the optoelectronic component via the conductive layer and the plurality of electrically conductive vias; and
   a housing disposed on at least the first side of the transparent substrate and further being disposed such that the optoelectronic component is at least partially encapsulated by the housing, the housing be substantially non-transmissive to the particular wavelength.

2. The optoelectronic module of claim 1, wherein the conductive layer includes a conductive film and a structuration, the structuration being configured to electrically isolate portions of the conductive film.

3. The optoelectronic module of claim 2, wherein the conductive film is at least partially composed of indium tin oxide.

4. The optoelectronic module of claim 1, wherein the conductive layer includes a plurality of conductive traces.

5. The optoelectronic module of claim 4, wherein the plurality of conductive traces is at least partially composed of copper.

6. The optoelectronic module of claim 1, in which the housing is disposed on lateral sides of the transparent substrate.

7. The optoelectronic module of claim 6, wherein the housing is disposed on at least a portion of the second side of the transparent substrate.

8. The optoelectronic module of claim 1 further comprising an optical element and/or optical film disposed on the electrically conductive layer.

9. The optoelectronic module of claim 8, wherein the optical element is an a diffuser, a refractive optical element, a diffractive optical element, a microlens array, and/or an optical filter.

10. The optoelectronic module of claim 1 further comprising an optical element and/or optical film disposed on the first side of the transparent substrate.

11. The optoelectronic module of claim 10, wherein the optical element is an a diffuser, a refractive optical element, a diffractive optical element, a microlens array, and/or an optical filter.

12. The optoelectronic module of claim 1, wherein the transparent substrate is at least partially composed of glass.

13. The optoelectronic module of claim 1 further comprising an aperture.

14. The optoelectronic module of claim 13, wherein at least a portion of the aperture is integrated into at least a portion of the structuration.

15. The optoelectronic module of claim 1 further comprising a baffle.

16. The optoelectronic module of claim 15, wherein at least a portion of the baffle is integrated into at least a portion of the structuration.

17. A method of manufacturing a plurality of discrete optoelectronic modules, the method comprising:
  providing a wafer assembly including a transparent substrate having first, second, and lateral sides, the wafer assembly further including a plurality of electrically conductive vias disposed between the first and second sides, the wafer assembly further including a conductive film disposed on the second side of the transparent substrate, the conductive film being in electrical communication with the electrically conductive vias;
  structuring the conductive film such that a plurality of structurations within the conductive film is generated, the conductive film and structuration being, at least in part, a conductive layer;
  mounting a plurality of optical elements onto the second side of the transparent substrate;
  mounting a mask onto the second side of the transparent substrate;
  applying an aperture material to the second side of the transparent substrate through the mask;
  mounting a plurality of optoelectronic components to the first side of the transparent substrate, each of the optoelectronic components being sensitive to and/or operable to generate a particular wavelength of electromagnetic radiation;
  curing the aperture material with electromagnetic radiation and/or thermal energy such that a plurality of apertures is formed, each of the apertures being substantially non-transmissive to the particular wavelength of electromagnetic radiation;
  mounting a housing tool to the first side of the transparent substrate;
  introducing formable material into the housing tool such that the plurality of optoelectronic components are at least partially encapsulated;
  curing the formable material with electromagnetic radiation and/or thermal energy such that a plurality of housings is formed, each of the housings being substantially non-transmissive to the particular wavelength of electromagnetic radiation; and
  dicing the wafer assembly such that a plurality of discrete optoelectronic modules are generated.

18. The method of claim 17 further comprising mounting a plurality of electrical connectors to the conductive layer, the electrical connectors being in electrical communication with the plurality of optoelectronic components via the conductive layer and the plurality of electrically conductive vias.

19. A method of manufacturing a plurality of discrete optoelectronic modules, the method comprising:
  providing a wafer assembly including a transparent substrate having first, second, and lateral sides, the wafer assembly further including a plurality of electrically conductive vias disposed between the first and second sides, the wafer assembly further including a conductive film disposed on the second side of the transparent substrate, the conductive film being in electrical communication with the electrically conductive vias;
  structuring the conductive film such that a plurality of structurations within the conductive film is generated, the conductive film and structuration being, at least in part, a conductive layer;
  mounting a plurality of optoelectronic components to the first side of the transparent substrate, each of the optoelectronic components being sensitive to and/or operable to generate a particular wavelength of electromagnetic radiation;
  dicing through the transparent substrate such that the wafer assembly includes a plurality of discrete components, each discrete component includes an optoelectronic component, transparent substrate, conductive film, and structurations within the conductive film;
  mounting the plurality of discrete components onto a sidewall tool;
  mounting a housing tool onto the sidewall tool;
  introducing a formable material into the sidewall tool and housing tool such that the plurality of discrete components is at least partially encapsulated in the formable material;
  curing the formable material with electromagnetic radiation and/or thermal energy such that a plurality of housings is formed, each of the housings being substantially non-transmissive to the particular wavelength of electromagnetic radiation;
  mounting a plurality of optical elements onto the second side of the transparent substrate;
  mounting a plurality of electrical connectors to the the conductive layer, the electrical connectors being in electrical communication with the plurality of optoelectronic components via the conductive layer and the plurality of electrically conductive vias;
  mounting a mask onto the second side of the transparent substrate;
  applying a baffle material to the second side of the transparent substrate through the mask;
  curing the baffle material with electromagnetic radiation and/or thermal energy such that a plurality of baffles is formed, each of the baffles being substantially non-transmissive to the particular wavelength of electromagnetic radiation;
  dicing through the wafer assembly such that a plurality of discrete optoelectronic modules are generated.

* * * * *